HIGH EFFICIENCY CLASS C AMPLIFIER

Filed Nov. 10, 1966

INVENTOR.
JOHN WILLIAM WOOD
BY Hopgood & Calimafde
ATTORNEYS.

United States Patent Office 3,430,157
Patented Feb. 25, 1969

3,430,157

HIGH EFFICIENCY CLASS C AMPLIFIER

John W. Wood, 2433 University Drive,
Valdosta, Ga. 31601

Filed Nov. 10, 1966, Ser. No. 593,417
U.S. Cl. 330—192 3 Claims
Int. Cl. H03f *1/02*

ABSTRACT OF THE DISCLOSURE

A radio frequency amplifier circuit is described wherein a pentode tube is operated in Class C and through a parallel resonance circuit is coupled to a tank circuit and a frequency-selective network. The parallel resonance network is tuned to a preselected frequency of substantially 1.5 times the carrier frequency of the input signal applied to the pentode tube.

Figures 1, 2A, 2B, 2C, 2D, 3:
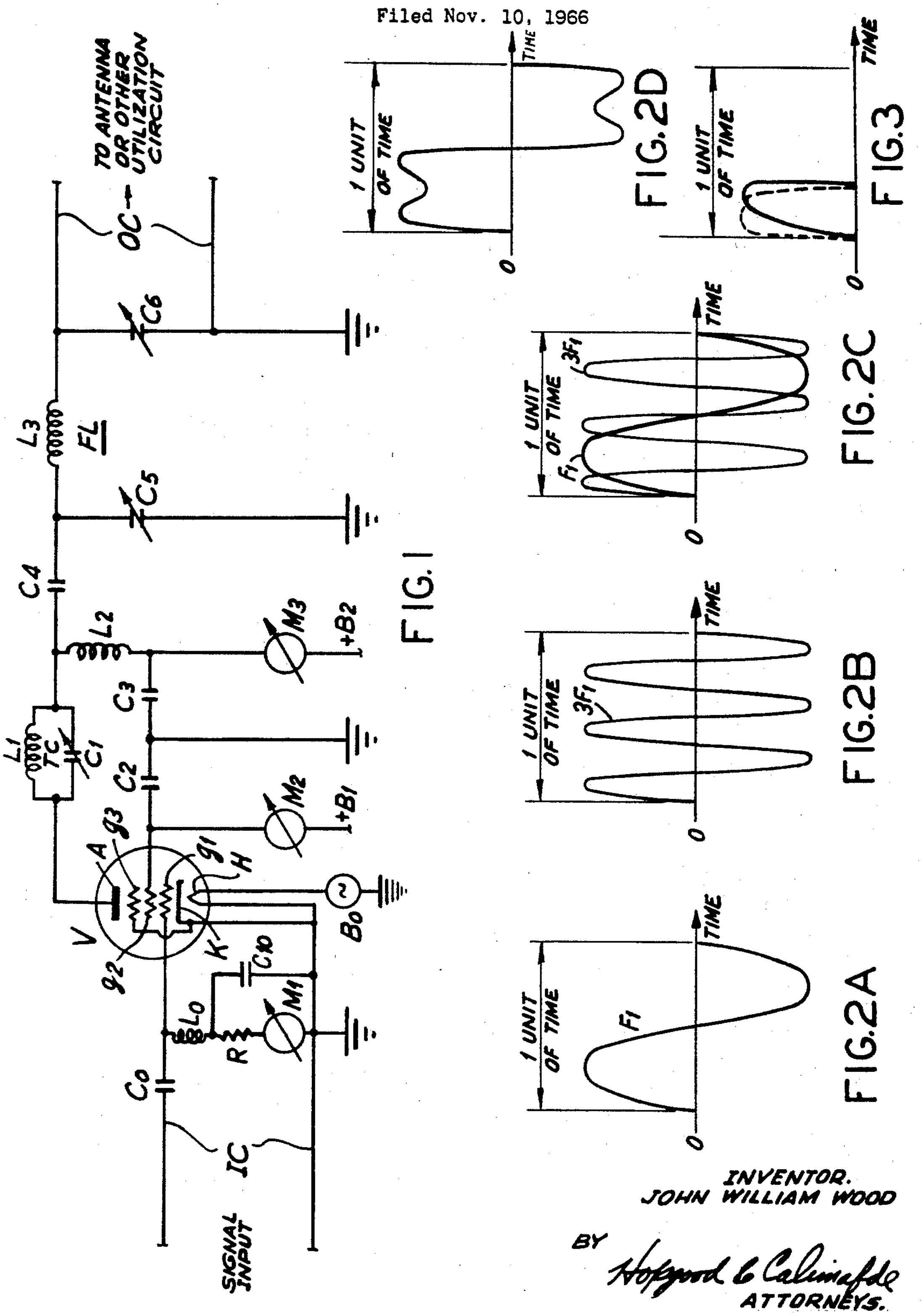

This invention relates to high efficiency amplifiers and, more particularly, to Class C amplifiers employing vacuum tubes of the pentode type for the amplification of radio frequency currents supplied to the amplifiers.

Conventional radio frequency amplifiers of the Class C type employing a vacuum tube of the pentode type as the amplifying component usually include a filter or other selective network in the output circuit to select and transmit the currents which have been amplified by the pentode tube. Such conventional amplifiers usually omit tuned circuits between the anode (or plate) of the pentode and the filter or selective network which feeds the amplified currents to the output circuit. Such amplifiers, however, have relatively poor plate efficiency. For example, tests performed on such an amplifier employing a pentode of the 6146 type show that it has a plate efficiency not exceeding 72%.

It is an object of the present invention to increase the efficiency of conventional radio frequency amplifiers of the Class C type employing amplifying elements of the pentode type. This may be accomplished, in accordance with this invention, by inserting between the anode of the pentode and the filter or other selective network which interconnects the anode with the output circuit, a parallel-tuned or anti-resonant circuit which has a resonant frequency equal to about 1.5 times the carrier frequency of the signals to be amplified. In other words, if the carrier current has a frequency F1, the parallel resonant circuit will have a resonant frequency of 1.5 F1 and the filter or other selective network which receives the amplified currents will be designed to transmit to the output circuit only the currents of the carrier frequency F1 and any signals or the band of signals, if any, which accompany the carrier frequency.

This invention will be better understood from the more detailed description hereinafter following when read in connection with the accompanying drawing in which FIG. 1 represents a schematic arrangement of equipment constituting a Class C amplifier of the radio frequency type to which this invention is applied; FIGS. 2A, B, C and D represent curves intending to explain the operation of the invention; and FIG. 3 illustrates two curves comparing the plate current pulse of a conventional Class C amplifier with the plate current pulse of a corresponding amplifier modified to embody the invention.

Referring to FIG. 1 of the drawing, the input circuit IC and the output circuit OC are interconnected by a so-called Class C amplifier which includes a pentode V. The upper terminal of the input circuit IC is connected to the control grid *g*1 of the tube V by a blocking condenser C0. The control grid *g*1 of tube V is connected to ground and to the cathode K of tube V by a circuit including a radio frequency choke coil L0, a grid leak resistor R and a meter M1. A condenser C10 bridges the circuit of resistor R and meter M1. The heater H of tube V is connected to a source of A.C. voltage B0. The screen grid *g*2 is connected to a source of positive voltage B1 by means of a meter M2. The cathode K of the tube V is connected to the suppressor grid *g*3 of the tube V, the cathode K being grounded. The anode A of tube V is connected to a parallel-tuned circuit TC which includes a coil L1 and a condenser C1. This tuned circuit is in turn connected to a source of positive voltage B2 through an RF choke coil L2 and a meter M3. The upper terminals of the meters M2 and M3 are connected to each other by condensers C2 and C3, the terminal common to these condensers being grounded. The tuned circuit TC is connected through a blocking condenser C4 to a selective network FL, sometimes called a filter or a low pass filter or a "PI-section tank." The selective network FL includes a series coil L3 and shunt condensers C5 and C6, both of which may be adjustable as shown. The selective network FL is in turn connected to the output circuit OC as shown.

The above described circuit of FIG. 1 includes the essential components making up a radio frequency Class C amplifier in accordance with this invention. It may be considered to differ from a corresponding conventional Class C amplifier only in that it includes, as an essential component, the tuned circuit TC which has certain specified characteristics as will be explained hereinafter.

If the input circuit receives current of a carrier frequency F1, with or without an accompanying band of signals, the network FL will transmit to the output circuit OC the amplified current of the frequency F1, with or without its accompanying band of signals as the case may be. If the tuned circuit TC were omitted, as in a corresponding conventional Class C amplifier having a pentode as an amplifying component, the efficiency would be relatively low, that is, considerably lower than the efficiency readily obtainable if the tuned circuit TC were added to make up the arrangement illustrated in FIG. 1.

The tuned circuit TC is designed to be resonant at a frequency substantially equal to 1.5 F1, where F1 represents the input signal or the input carrier frequency of one or more bands of signals. Indeed the tuned circuit TC will exhibit a maximum of impedance to current of its own resonant frequency 1.5 F1. Naturally, the tuned circuit TC will also introduce considerable impedance to the second and fourth harmonics, 3 F1 and 6 F1, respectively, of its own resonant frequency which is 1.5 F1. The second harmonic of the tuned circuit TC, 3 F1, will be the third harmonic of the incoming signal or the carrier frequency, and 6 F1, the fourth harmonic of tuned circuit TC, will be the sixth harmonic of the incoming signal F1. The second and fourth harmonics 3 F1 and 6 F1, however, will be suppressed to a considerable extent by the anti-resonant circuit TC. Furthermore, the network FL which is designed to pass the input current F1 and any accompanying signals or band of signals will substantially eliminate these higher frequencies (3 F1 and 6 F1) so that they will not reach the output circuit OC.

In the practice of this invention, the tuned circuit TC may be adjusted, by means of its condenser C1, to be resonant at or near a frequency equalling 1.5 times the frequency of the signal or of the carrier supplied by input circuit IC. The condensers C5 and C6 of the selective network FL will be adjusted to yield the greatest response, that is, the strongest signal, to the output circuit OC. If desired, a meter or other signal responsive device (not shown) may be connected to the output circuit OC to indicate the best received amplified signal.

The output circuit OC preferably should be designed for a predetermined characteristic impedance of, for example, 50 ohms, substantially free of any reactance. It will be apparent that the output circuit OC may be connected to an antenna and ground for transmitting through an appropriate network the amplified currents to a distant point.

FIG. 2A illustrates the output voltage for an input or applied current of frequency F1 as it reaches the output circuit OC in a conventional Class C amplifier of the kind previously noted which, as already explained, does not include the tuned circuit TC. FIG. 2B illustrates a curve corresponding to the voltage supplied to or generated by the tuned circuit TC when the latter circuit TC is included as a part of the arrangement of this invention. That is, a sinusoidal input current at IC will develop a voltage of frequency 3 F1 of the character shown in FIG. 2B across the tuned circuit TC of FIG. 1. As already noted, the tuned circuit TC and the selective network FL will materially reduce the voltage of this frequency so that this frequency will not reach the output circuit OC.

FIG. 2C illustrates two curves superimposed upon each other to represent the wave forms of the fundamental or carrier frequency F1 (as shown in FIG. 2A) and the third harmonic 3 F1 (as shown in FIG. 2B). These superimposed wave forms represent voltages that would be expected to be present at the anode A of the pentode V. The amplitudes of the two waves may be quite different from each other, however.

FIG. 2A shows a waveform corresponding to voltage appearing in the output circuit OC when the tuned circuit TC is part of the amplifier shown in FIGURE 1. FIGURE 2D shows the voltage waveform obtainable at the anode A of tube V.

FIG. 3 illustrates, in the curve there shown in solid form, the plate current for a conventional type of Class C amplifier when a sine wave of appropriate frequency is supplied to the input circuit IC. In contrast, the dotted curve of FIG. 3 represents the plate current in the amplifier of this invention, that is, in the amplifier of FIG. 1, when a similar sine wave is supplied to the input circuit IC. It will be observed that the plate current reaches its maximum magntiude very rapdily in the arrangement of this invention and is apidly returned to its minimum value substantially at the end of the pulse. The difference in the slopes of the two curves of FIG. 3 is due primarily to the difference in the efficiences of the two amplifiers, the amplifier of this invention operating at a considerably higher efficiency.

The following components were employed in a sample amplifier conforming to FIG. 1 in amplifying a signal of 3.2 megacycles per second:

| | |
|---|---|
| V | 6146 type pentode. |
| L0 | 2 mh. |
| L1 | 5.93 μh. |
| L2 | 2.5 mh. |
| L3 | 9.5 μh. |
| C0, C2, C3, C10 | 0.01 μf. |
| C1 | 180 μμf. (adjustable). |
| C4 | .006 μf. |
| C5 | 150 μμf. (adjustable). |
| C6 | 1500 μμf. (adjustable). |
| B0 | 6.3 v. A.C. |
| B1 | +180 v. D.C. |
| B2 | +1250 v. D.C. |

Meters M1, M2 and M3 normally carry currents of approximately 3.1, 11.0, and 144 ma. respectively.

The amplifier circuit of this invention will enable a given pentode, such as the 6146 pentode, to handle conventiently some two or more times the input power of a conventional circuit employing the same type of pentode. The circuit of this invention will deliver some 2½ times as much output power to the load or output circuit OC as such a corresponding conventional circuit.

It was found that if the power input for a conventional amplifier employing a pentode were designed to receive some 90 watts, the arrangement of this invention, on the other hand, would be able to handle approximately twice the conventional input power, or some 180 watts. Furthermore, the arrangement of this invention will deliver some 2.46 times as much output power to the output circuit OC as a conventional circuit arrangement. The plate efficiency will be some 89%.

If the arrangement of FIG. 1 is employed as part of a carrier current communication system, the input circuit would receive one or more side bands, which might be upper side band or bands, or the lower side band or bands, or both upper and lower side bands, of a particular carrier frequency current, as is well known to those skilled in the art. In such systems the carrier current component per se may obviously be suppressed and not transmitted to the input circuit. In such cases, however, in accordance with this invention, the parallel tuned circuit TC would preferably be made resonant at a frequency substantially equal to 1.5 times the frequency of the carrier current. Such a tuned circuit would result in high efficiency amplifier operation, as already explained, with the many attendant savings in equipment, power, costs, etc.

The circuit arrangement of FIG. 1 has been described as an RF Class C amplifier which may be part of a radio transmitter. It will be apparent, however, that this same arrangement may be employed as a component of oscillators, drivers, and other types of networks which might normally embody an arrangement similar to the one of this invention. When used as part of any such networks, the size of the equipment and the number of tubes may be substantially reduced for any given power requirements. Furthermore, the overall cost of the equipment would be substantially reduced.

While this invention has been shown and described in certain particular embodiments merely for the purpose of illustration, it will be generally understood that the principles of this invention may be applied to other and widely varied organizations without departing from the spirit of the invention and the scope of the appended claims.

What is claimed is:

1. A high efficiency amplifier circuit of the Class C type for supplying an amplified radio frequency carrier signal to an output circuit comprising
- a vacuum tube of the pentode type, said tube having an output electrode and a control grid,
- an input circuit connected to the control grid of said vacuum tube and transmitting current of a carrier frequency,
- a parallel anti-resonant circuit coupled to the output electrode and adjusted to resonate at a frequency substantially equal to 1.5 times the frequency of the carrier current supplied by said input circuit,
- a frequency-selective network coupled to the output circuit and including a series inductive element and at least one shunt element, said network elements being selected for transmitting the current of the carrier frequency after amplification and for substantially suppressing all currents of substantially higher frequencies, the parallel circuit and the selective network being connected in tandem with each other between the output electrode of the tube and the output circuit.

2. A claim according to claim 1 in which the parallel anti-resonant circuit and the selective network are adjustable to accommodate carrier currents of different frequencies transmitted by said input circuit.

3. A Class C radio frequency amplifier comprising
- an input circuit supplying a carrier current and band of signals, a vacuum tube of the pentode type having an output electrode and operated in Class C, said tube being connected to said input circuit for amplifying the currents supplied by said input circuit,
- a frequency-selective load circuit for receiving the input currents after amplification by said vacuum tube, and a parallel anti-resonant circuit interposed between the output electrode of said vacuum tube and said load circuit, said parallel anti-resonant circuit being tuned to resonate at a frequency substantially equal to 1.5 times the frequency of the carrier current.

References Cited

UNITED STATES PATENTS

| | | | |
|---|---|---|---|
| 2,364,260 | 12/1944 | Winkler | 330—154 |
| 2,429,652 | 10/1947 | Terman | 330—192 X |
| 2,790,035 | 4/1957 | Hylas et al. | 330—192 X |
| 3,230,471 | 1/1966 | Martens | 330—192 X |

NATHAN KAUFMAN, *Primary Examiner.*

U.S. Cl. X.R.

330—185